(12) United States Patent
Hein

(10) Patent No.: US 11,172,578 B2
(45) Date of Patent: Nov. 9, 2021

(54) FILLING ASSEMBLY

(71) Applicant: ITC Intercircuit Electronic GmbH, Munich (DE)

(72) Inventor: Hubertus Hein, Bad Berka (DE)

(73) Assignee: ITC Intercircuit Electronic GmbH, Munich (DE)

( * ) Notice: Subject to any disclaimer, the term of this patent is extended or adjusted under 35 U.S.C. 154(b) by 0 days.

(21) Appl. No.: 16/933,364

(22) Filed: Jul. 20, 2020

(65) Prior Publication Data

US 2021/0037655 A1     Feb. 4, 2021

(30) Foreign Application Priority Data

Aug. 1, 2019   (DE) .......................... 102019120873.4

(51) Int. Cl.
*H05K 3/00*     (2006.01)

(52) U.S. Cl.
CPC ......... *H05K 3/0088* (2013.01); *H05K 3/0094* (2013.01); *H05K 2203/082* (2013.01); *H05K 2203/1509* (2013.01)

(58) Field of Classification Search
CPC ............ H05K 3/0088; H05K 3/0094; H05K 2203/082; H05K 2203/1509; H05K 3/4069; B41F 15/36; Y10T 29/49155; Y10T 29/4965; Y10T 29/532
USPC .......................................... 29/845, 852, 745
See application file for complete search history.

(56) References Cited

U.S. PATENT DOCUMENTS

| | | | | |
|---|---|---|---|---|
| 5,327,828 A | * | 7/1994 | Barocas | B41F 15/36 101/127 |
| 6,454,154 B1 | * | 9/2002 | Pedigo | H05K 3/1233 228/256 |
| 6,817,288 B2 | * | 11/2004 | Flatt | B41F 15/36 101/114 |
| 2010/0307353 A1 | | 12/2010 | Willshere | |

OTHER PUBLICATIONS

Deutsches Patent- und Markenamt, Office Action for DE Application No. 10 2019 120 873.4, dated Mar. 30, 2020, pp. 1-5.

* cited by examiner

*Primary Examiner* — Donghai D Nguyen
(74) *Attorney, Agent, or Firm* — Cahn & Samuels, LLP

(57) ABSTRACT

A filling assembly for filling holes formed in a board with a filling material, including: a board holding device having a carrier frame formed by frame elements to hold the board; a filling device arranged on a side of the carrier frame and includes a filling material feeding device with a filling head to provide filling material to the board, wherein the filling head is movable relative to the carrier frame parallel to the carrier frame surface; a screen holding frame formed by screen holding frame elements to hold a screen between the carrier frame and the filling device, wherein the screen includes a screen cloth surrounded by a screen frame; and a fixing device with an expansion element arranged in a frame element, wherein the expansion element can provide a temporary compressive force to the screen frame to fixedly press the screen frame against a screen holding frame.

17 Claims, 12 Drawing Sheets

FILLING ASSEMBLY

CROSS-REFERENCE TO RELATED APPLICATIONS

The present application claims priority from German Pat. App. No. DE 10 2019 120 873.4, filed on Aug. 1, 2019, the contents of which are incorporated herein by reference.

TECHNICAL FIELD

The present disclosure relates to a filling assembly, and in particular to a filling assembly for filling holes formed in a board, e.g., a printed circuit board, with a filling material.

BACKGROUND

In the production of multilayered printed circuit boards, holes are formed in these or in individual layers thereof, for example to generate contact between opposite sides of the circuit board or individual or several layers of the printed circuit board, which pass the board and/or the respective layer(s) in the direction of the board and/or layer thickness. The holes are then filled with a conductive material. Alternatively, for the purpose of cost-savings, the holes are coated for example only on their peripheral walls with metal, and are then closed again with a cost-effective filling material by means of a filling assembly. For this purpose, the filling material is fed to the printed circuit board through a screen which is equipped with a mask and is aligned with the mask with respect to the printed circuit board in such a way that only holes to be filled are filled (e.g., selectively). During such a filling process, strong forces may act on the screen, such as, for example, by pressing a filling head against the screen for hole filling and/or by a vacuum generated in the filling head for hole filling, which forces may displace the screen aligned with the printed circuit board in such a way that the holes to be filled cannot be filled or can only be filled insufficiently.

BRIEF DESCRIPTION OF THE DRAWINGS

Various aspects of the present disclosure are explained below by means of example embodiments with reference to the following drawings.

Figure 1:
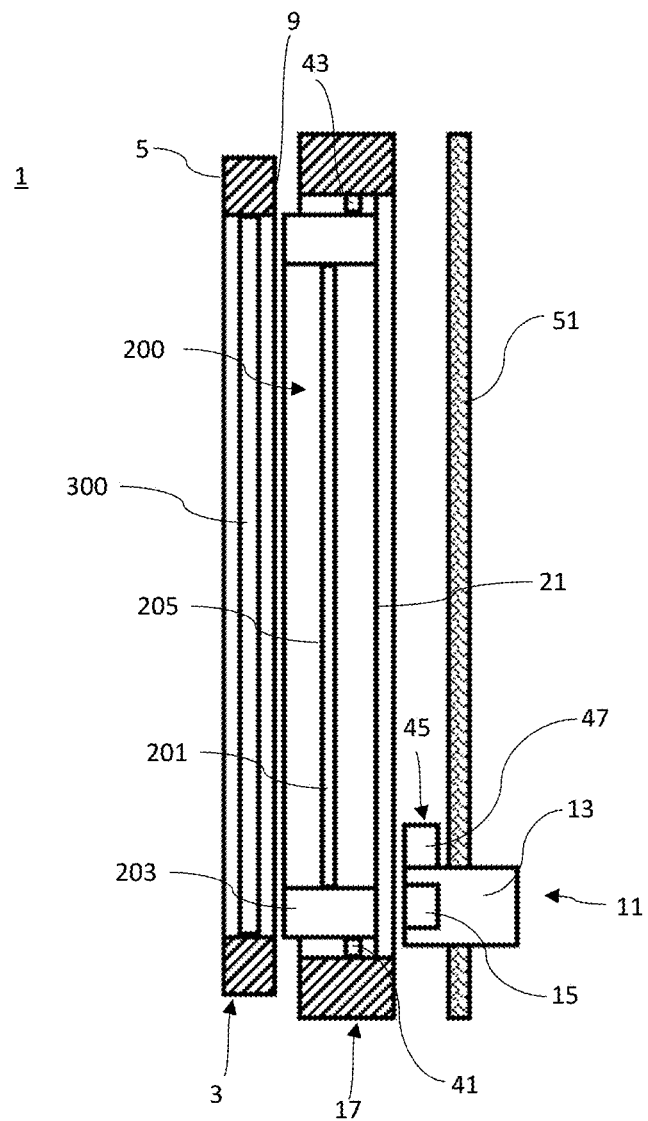
FIG. 1 schematically shows components of a filling assembly according to an embodiment of the present disclosure in a lateral sectional view, FIG. 2 schematically shows a board and a carrier frame of a board holding device of a filling assembly according to an embodiment of the present disclosure in a frontal view, FIG. 3 schematically shows a screen holding frame of a filling assembly according to an embodiment of the present disclosure in a frontal view, FIG. 4 schematically shows an enlargement of a section of FIG. 3, FIG. 5 schematically shows a screen and a screen holding frame of a filling assembly according to an embodiment of the present disclosure in a frontal view, FIG. 6 schematically shows components of a filling assembly according to an embodiment of the present disclosure in a lateral sectional view, FIG. 7 schematically shows a carrier frame of a board holding device of a filling assembly according to an embodiment of the present disclosure in a side view, FIG. 8 schematically shows a section of components of a filling assembly according to an embodiment of the present disclosure in a sectional view, FIGS. 9A and 9B each schematically show an enlarged section of FIG. 8, FIG. 10 schematically shows a filling assembly according to an embodiment of the present disclosure.

Throughout the figures, identical or similar components are provided with the same reference signs.

DESCRIPTION

The following detailed description refers to the accompanying drawings that show, by way of illustration, example details and aspects in which the disclosure may be practiced.

Various aspects of the present disclosure relate to a filling assembly.

A filling assembly, and in particular a filling assembly for filling holes formed in a board, e.g., a printed circuit board, with a filling material, which allows the screen to be easily and securely attached and fixed to the filling assembly is provided in the present disclosure.

For this purpose, the present disclosure provides a filling assembly for filling holes (e.g., through holes and/or blind holes) formed in a board, e.g., a printed circuit board, with a filling material (such as an epoxy resin), including: a board holding device including a carrier frame which is formed by frame elements and which defines an at least substantially vertical carrier frame surface and by which the board can be held at least substantially parallel to the carrier frame surface (e.g., when the board holding device is arranged or loaded with a board), at least one filling device arranged on a side of the carrier frame and including a filling material feeding device with a filling head, by means of which a filling material can be supplied to the board held by the carrier frame from a board side, wherein the filling head is movable relative to the carrier frame at least substantially parallel to the carrier frame surface along at least one dimension (e.g., vertically), at least one screen holding frame formed by screen holding frame elements and defining a screen holding frame surface and by which a screen can be held between the carrier frame and the filling device, so that the filling material can be fed (e.g., in operation) to the board, held by the carrier frame, by means of the filling head, passing through the held screen, the screen including a screen cloth and a screen frame surrounding the screen cloth, and a fixing device including at least one pneumatically or hydraulically operable (e.g., reversibly expandable) expansion element which is arranged in one or more of the frame elements and by which, by means of pneumatically or hydraulically effected reversible expansion, a compressive force acting at least substantially perpendicular to the carrier frame surface can be applied to the screen frame of the held screen, in order to press the screen frame against the screen holding frame to fix the screen to the screen holding frame.

The board holding device may further include at least one fitting pin, e.g., two fitting pins, via which, introduced in a respective retaining opening, e.g., fitting bore, provided in the board and corresponding to the respective fitting pin, and fixed to one or more of the frame elements, the board may be held by the carrier frame (e.g., at an upper edge and a lower edge of the board).

The carrier frame may (in a direction perpendicular to the carrier frame surface) be formed by means of the frame elements in a layered construction, e.g., a sandwich construction. In this respect, the carrier frame may be formed from several carrier frame layers, wherein, for example, one or more frame elements may form such a carrier frame layer. The carrier frame may, for example, include two covering carrier frame layers and one or more middle carrier frame layers arranged therebetween. The frame elements may, for example, be arranged in pairs opposite each other, and the frame elements may be mounted together or may also be formed monolithically. Accordingly, the screen holding frame elements may, for example, be arranged opposite each other in pairs, and the screen holding frame elements may be mounted together or may be formed monolithically. The at least one pneumatically or hydraulically operable expansion element may be arranged in the one or more middle carrier frame layers, wherein, in at least one of the covering carrier frame layers, an opening corresponding to the expansion element is formed, through which the expansion element may expand pneumatically or hydraulically and reversibly. Furthermore, for example, a respective opening corresponding to the expansion element and located opposite each another with respect to the respective covering carrier frame layers may also be formed in both covering carrier frame layers, through which opening the expansion element may in each case expand pneumatically or hydraulically (and reversibly) (i.e., in each case in the direction of the respective covering carrier frame layer) (e.g., so that the expansion element extends through the carrier frame in the direction perpendicular to the carrier frame surface and protrudes from the same). The fixing device may further include pneumatic or hydraulic lines which are connected to the expansion element and which are connectable (e.g., connected) to a pneumatic or hydraulic source for providing a pneumatic or hydraulic pressure. For example, the filling assembly may also include this pneumatic or hydraulic source. The pneumatic or hydraulic lines may be arranged in one or more of the frame elements. For example, the pneumatic or hydraulic lines may be arranged in the one or more middle carrier frame layers.

The filling assembly may further be provided with a negative pressure device which is arranged at one or more of the screen holding frame elements and by means of which a negative pressure (for example a vacuum) can be generated (reversibly) at an abutment surface formed by the screen holding frame elements, on which the screen frame of the held screen abuts on the screen holding frame screen (i.e., a negative pressure can be generated and released again), by which a suction force acting at least substantially perpendicular to the carrier frame surface, is caused in order to draw or suction the screen frame to the screen holding frame to fix the screen to the screen holding frame. This further intensifies the fixing of the screen to the screen holding frame caused by the expansion element, so that a probability of a relative displacement of the screen with respect to the held board can be further reduced.

The negative pressure device may further include at least one opening formed in the abutment surface on at least one or more of the screen holding frame elements through which air may be withdrawn by suction by means of the negative pressure device to create the negative pressure to cause the suction force.

The negative pressure device may include at least one seal, optionally an O-ring seal, which delimits a suction area extending along the abutment surface and against which the screen frame of the screen held (in the screen holding frame) may tightly abut, in order to enable the negative pressure to be generated between the screen frame and the abutment surface in the suction area.

For example, the suction area is formed to be elongated and extends in its longitudinal direction along the screen holding frame elements. The suction area may be uninterrupted or may be divided into separate sub-suction areas, with the sub-suction areas being spaced for example along the screen holding frame elements.

The negative pressure device may include at least one further (i.e., additional) seal, e.g, one further (i.e., additional) O-ring seal, which delimits a further (i.e., additional) suction area configured in a manner similar to the suction area described above, the suction area and the further suction area being located on opposite screen holding frame elements and being aligned thereon, for example opposite one another (e.g., wherein, as viewed from the carrier frame, one (e.g., first) suction area is located on one or more screen holding frame elements arranged on the left and one (e.g., second) suction area is located on one or more screen holding frame elements arranged on the right, and/or wherein, as viewed from the carrier frame, one (e.g., first, e.g., third) suction area is located on one or more screen holding frame elements arranged at the top and one (e.g., second, e.g., fourth) suction area is located on one or more screen holding frame elements arranged at the bottom). This means that several suction areas as described above may also be defined along the abutment surface by means of a respective seal as described above, which (i.e., the suction areas) are optionally (in a respectively assigned way) located on opposite screen holding frame elements.

The pneumatically or hydraulically operable expansion element of the fixing device may, for example, be a rubber balloon and/or a bellows expansion element, optionally an operable bellows cylinder, and/or the pneumatically or hydraulically operable expansion element of the fixing device may be made of an elastic material, optionally a rubber, (e.g., at least partially, e.g., completely).

The fixing device may have at least one further (i.e., additional) pneumatically or hydraulically operable expansion element configured in a manner as the expansion element described above, the expansion element and the further expansion element being located on opposite frame elements. That is, the fixing device may also include several pneumatically or hydraulically operable expansion elements as described above, which are optionally (in a respectively assigned way) located on opposite frame elements and are aligned thereon, for example, in a way opposite one another.

A respective suction area may be arranged opposite to a respective expansion element. This arrangement may, for example, be such that the pressure force which can be caused by the respective expansion element and the suction force which can be caused by the negative pressure device in the respective suction area can add up at a same point to form a fixing force that can be applied to the screen frame (wherein, for example, a total fixing force which can be applied to the screen frame results from the sum of respective fixing forces and/or from the sum of respective pressure forces and respective suction forces).

At least one actuating element, e.g., an electric actuator, which may be engaged with the screen frame of the held screen, may be arranged on and/or in one or more of the screen holding frame elements, in order to be able to adjust the held screen relative to the screen holding frame at least substantially in a direction parallel to the screen holding frame surface. The electric actuator may, for example, include a step motor.

On and/or in one or more of the screen holding frame elements, an elastic element may be arranged which may be engaged with the screen frame of the held screen in order to support the held screen relative to the screen holding frame in a spring-elastic manner at least substantially in a direction parallel to the screen holding frame surface. The elastic element may be, e.g., a compression spring and/or e.g., a coil spring and/or e.g., a gas spring. The elastic element may be arranged opposite to the actuating element.

The filling device may further include a filling material source (e.g., a filling material cartridge) and a line connectable (e.g., connected) to the filling material source, which is connected to the filling material feeding device and through which the filling material feeding device can obtain filling material.

The filling assembly may further include a control device and a camera device including at least one camera which is connected to the control device and which is arranged and configured to obtain image information of the board and the screen and then to provide this image information to the control device so that a relative alignment of the board and the screen with respect to each other can be determined by the control device. The control device may also be connected to the actuating element to be able to drive the same based on information of the relative alignment of the board and screen with respect to each other, so that said alignment may be manipulated by means of adjusting the screen by the respective actuating device. The respective camera of the camera device may be mounted on the filling device and may (therefore) be movable relative to the carrier frame at least substantially parallel to the carrier frame surface along at least one dimension (e.g., vertically) and may for example also be movable relative to the filling device at least substantially parallel to the carrier frame surface along at least one further dimension (e.g., horizontally) in order to be able to visually capture both the entire board and the entire screen cloth (wherein the parallel distance between board and screen may be bridged by changing a focus point of the camera). In combination, a further (i.e., additional) camera of the camera device may be provided, which is movable relative to the carrier frame at least substantially parallel to the carrier frame surface along at least two dimensions (e.g., vertically and horizontally) (without being mounted on the filling device) and which is also connected to the control device (e.g., the two cameras may each visually capture the board and the screen in a respectively assigned way). Alternatively, the camera of the camera device may also be movable relative to the carrier frame at least substantially parallel to the carrier frame surface along at least two dimensions (e.g., vertically and horizontally) without being mounted on the filling device.

The filling assembly may further be provided with a movement device, by which the board holding device is movably supported so that the board holding device is movable in a direction at least substantially parallel to the carrier frame surface and e.g., at least substantially horizontal (or e.g., at least substantially vertical) between a loading and unloading position in which the board holding device is positioned out of operative engagement with the filling device to enable a filled board to be removed from the carrier frame and the carrier frame to be loaded with a board having holes to be filled, and a hole filling position in which the board holding device is positioned in operative engagement with the filling device to enable holes in a held board to be filled with filling material.

The screen holding frame may be pivotable about an at least substantially vertical (or e.g., about an at least substantially horizontal) pivot axis between a first position in which the screen holding frame is positioned with its screen holding frame surface at least substantially parallel to the carrier frame surface and a second position in which an angle is formed between the screen holding frame surface and the carrier frame surface. A pivoting of the screen holding frame may, for example, be effected manually or automatically (e.g., by means of an automatic pivoting mechanism which may be included in the filling assembly).

The pivot axis may be located on a side of the board holding device opposite the loading and unloading position with respect to the board holding device.

The filling assembly may further include the screen.

The filling assembly may further include: a further (i.e., additional) filling device which is arranged in the direction perpendicular to the carrier frame surface on the opposite, other side of the carrier frame and which is configured in a manner similar to the filling device described above, and a further (i.e., additional) screen holding frame for holding a further (i.e., additional) screen, said further screen holding frame and said further screen each being configured in a manner similar to the previously described screen holding frame and the previously described screen, wherein the fixing device may be configured in a manner to also fix the further screen to the further screen holding frame in a manner as previously described with respect to the screen and the screen holding frame, wherein the at least one pneumatically or hydraulically operable expansion element of the fixing device may be configured in such a way that a compressive force, which acts at least substantially perpendicular to the carrier frame surface, can also be applied by it to the further screen frame of the further held screen by means of pneumatically or hydraulically effected reversible expansion, in order to press the further screen frame against the further screen holding frame to fix the further screen to the further screen holding frame.

The filling assembly may further include the further screen.

The filling assembly may be provided in combination with at least one board, optionally at least one printed circuit board, in which holes are formed. The holes are, for example, through holes extending in a thickness direction of the board from one board side to the other board side and/or blind holes extending in the thickness direction of the board from one board side without penetrating the board. The blind holes may be arranged on both sides of the board (e.g., differently).

The filling assembly may be connected to a power source via a power line. The filling assembly may include at least one control device, e.g., the control device described above, configured to control at least the (e.g., respective) filling device and the fixing device. Furthermore, the control device may be configured to control the camera device and/or the movement device of the board holding device and/or the automatic pivoting mechanism and/or the actuating element(s).

In addition, the present disclosure provides a method of operating a filling assembly for filling holes (e.g., through holes and/or blind holes) formed in a board, optionally a printed circuit board, with a filling material (such as an epoxy resin), which is configured as described above, the method including: vertically holding the board in the board holding device (by means of the carrier frame) (e.g., in the hole filling position), arranging a respective screen including a screen cloth and a screen frame surrounding the screen cloth in the respective screen holding frame in such a way that a screen surface defined by the respective screen is at least substantially parallel to the screen holding frame surface, arranging the respective screen holding frame and the board holding device relative to each other such that the respective screen is positioned on a respectively assigned board side in such a way that the respective screen surface is substantially parallel to the board, aligning the respective screen with the holes formed in the board by moving the respective screen relative to the respective screen holding frame in a direction parallel to the screen holding frame surface (e.g., by means of the actuating elements), fixing the respective screen to the respective screen holding frame, and operating the respective filling device to fill the holes on a respective board side, wherein fixing the respective screen to the respective screen holding frame includes: applying pneumatic or hydraulic pressure to the expansion element of the fixing device to expand the expansion element, to thereby apply a compressive force acting substantially perpendicular to the carrier frame surface to the screen frame of the respective screen, so that the screen frame of the respective screen, to fix the same to the respectively assigned screen holding frame, is pressed against the same.

Fixing the respective screen to the respective screen holding frame may further include: first applying pneumatic or hydraulic pressure to the expansion element of the fixing device, which is applied until the screen frame of the respective screen is pressed into tight contact with the respective seal of the negative pressure device on the respective screen holding frame, and then operating the negative pressure device on the respective screen holding frame to generate a negative pressure (e.g., a vacuum) in the suction area delimited by the respective seal, thereby causing a suction force acting substantially perpendicular to the carrier frame surface and applied to the screen frame of the respective screen, so that the screen frame of the respective screen, to (additionally) fix the same to the respectively assigned screen holding frame, is drawn or suctioned to the same.

The method may further include: before holding the board vertically in the board holding device, arranging (e.g., loading) the board holding device with the board (e.g., in the loading and unloading position) so that the board is held vertically (e.g., substantially vertically) by the board holding device (by means of the carrier frame).

The vertical holding of the board in the board holding device may include: vertically holding the board in the board holding device (by means of the carrier frame) in the loading and unloading position, moving the board holding device with the vertically held board from the loading and unloading position to the hole filling position by means of the movement device, in order to be able to fill the holes in the held board with filling material, pivoting the respective screen holding frame about its pivot axis from its second position, in which an angle is formed between the respective screen holding frame with its screen holding frame surface and the carrier frame surface, to its first position in which the screen holding frame is arranged with its screen holding frame surface at least substantially parallel to the carrier frame surface, and maintaining the vertical holding of the board in the board holding device in the hole filling position.

The method may further include: after operating the respective filling device for filling the holes, releasing the respective screen by reducing the applied pneumatic or hydraulic pressure of the expansion element for shrinking the expansion element, to thereby reduce the compressive force exerted on the screen frame of the respective screen such that the screen frame of the respective screen is no longer pressed against the respective screen holding frame, and, for example, by reducing the negative pressure in said suction area, to thereby reduce the suction force exerted on the screen frame of the respective screen in such a way that the screen frame of the respective screen is no longer drawn or suctioned to the respective screen holding frame.

The method may further include: after releasing the respective screen, pivoting the respective screen holding frame about its pivot axis from its first position to its second position, moving the board holding device with the vertically held board (e.g., with the holes filled) from the hole filling position to the loading and unloading position by means of the movement device, in order to be able to remove the held board from the board holding device, and removing (e.g., unloading) the board from the board holding device.

When the board holding device is now loaded with a subsequent board (e.g., another board following the board, e.g., a second board) having holes to be filled that are positioned the same as the previously filled board, as previously described, to fill the holes thereof, the previously described method can be applied, wherein a repositioning of a respective screen and a repositioning of the respective screen holding frame and the board holding device relative to each other is not necessary (but can also be carried out). An/the arranging of a respective screen and an/the arranging of the respective screen holding frame and the board holding device relative to each other need normally only be performed before a first hole filling operation of a board and/or in case of a possible respective screen change.

By means of the previously described example embodiments of the present disclosure, it is possible to easily and safely attach and fix a respective screen to the filling assembly (by means of the fixing device and, optionally, the respective negative pressure device). Thereby, it is possible to better ensure that the screen cannot move relative (to the holes of the board) to the hole filling mask applied to the screen cloth of the screen in a state aligned with respect to the holes, so that a complete filling of the respective holes can be achieved more reliably. As a result, it is possible to reduce an amount of deficient boards by means of the described filling assembly, so that a filling assembly with improved efficiency can be provided by the described exemplary embodiments. In addition, the fixing device and, optionally, the respective negative pressure device allow to operate in a continuous production process of boards or in a continuous process for operating the filling assembly and to reliably fix a respective screen, so that furthermore the productivity of the described filling assembly can be increased. Furthermore, because the screen can be fixed more reliably, the filling device can be operated with higher pressure forces and/or with a faster generated vacuum, so that holes formed in the board can be filled faster and consequently the efficiency of the filling assembly can be further increased.

Referring to FIGS. 1-10, a filling assembly 1 for filling holes formed in a board 300, e.g., a printed circuit board, with a filling material (such as a paste-like epoxy resin), includes: a board holding device 3 which includes a carrier frame 5 which is formed by frame elements 7 and which defines an at least substantially vertical carrier frame surface 9 and by which the board 300 can be held at least substantially parallel to the carrier frame surface 9, a filling device 11, which is arranged on a side of the carrier frame 5 and which includes a filling material feeding device 13 with a filling head 15, by means of which a filling material can be fed to the board 300, held by the carrier frame 5, from a board side, the filling head 15 being movable relative to the carrier frame 5 at least substantially parallel to the carrier frame surface 9 along a dimension (e.g., vertically) (e.g., by means of (e.g., at least) a spindle drive 51), a screen holding frame 17 which is formed by screen holding frame elements 19 and which defines a screen holding frame surface 21 and by which a screen 200 can be held between the carrier frame 5 and the filling device 11, so that the filling material can be fed by means of the filling head 15 to the board 300 held by the carrier frame 5, passing through the held screen 200, wherein the screen 200 includes a screen cloth 201 and a screen frame 203 surrounding the screen cloth 201, and a fixing device 23 with at least one pneumatically and reversibly operable expansion element 25 (in FIG. 2 with eight pneumatically operable expansion elements 25), which is arranged in one or more of the frame elements 7 and by which a compressive force, which acts at least substantially perpendicular to the carrier frame surface 9, can be applied to the screen frame 203 of the held screen 200 by pneumatically caused reversible expansion, in order to press the screen frame 203 against the screen holding frame 17 to fix the screen 200 to the screen holding frame 17.

The filling device 11 described above further includes a filling material source and a line connected to the filling material source (both not shown in the figures), which is connected to the filling material feeding device 13 and through which the filling material feeding device 13 can obtain filling material.

Figure 2:
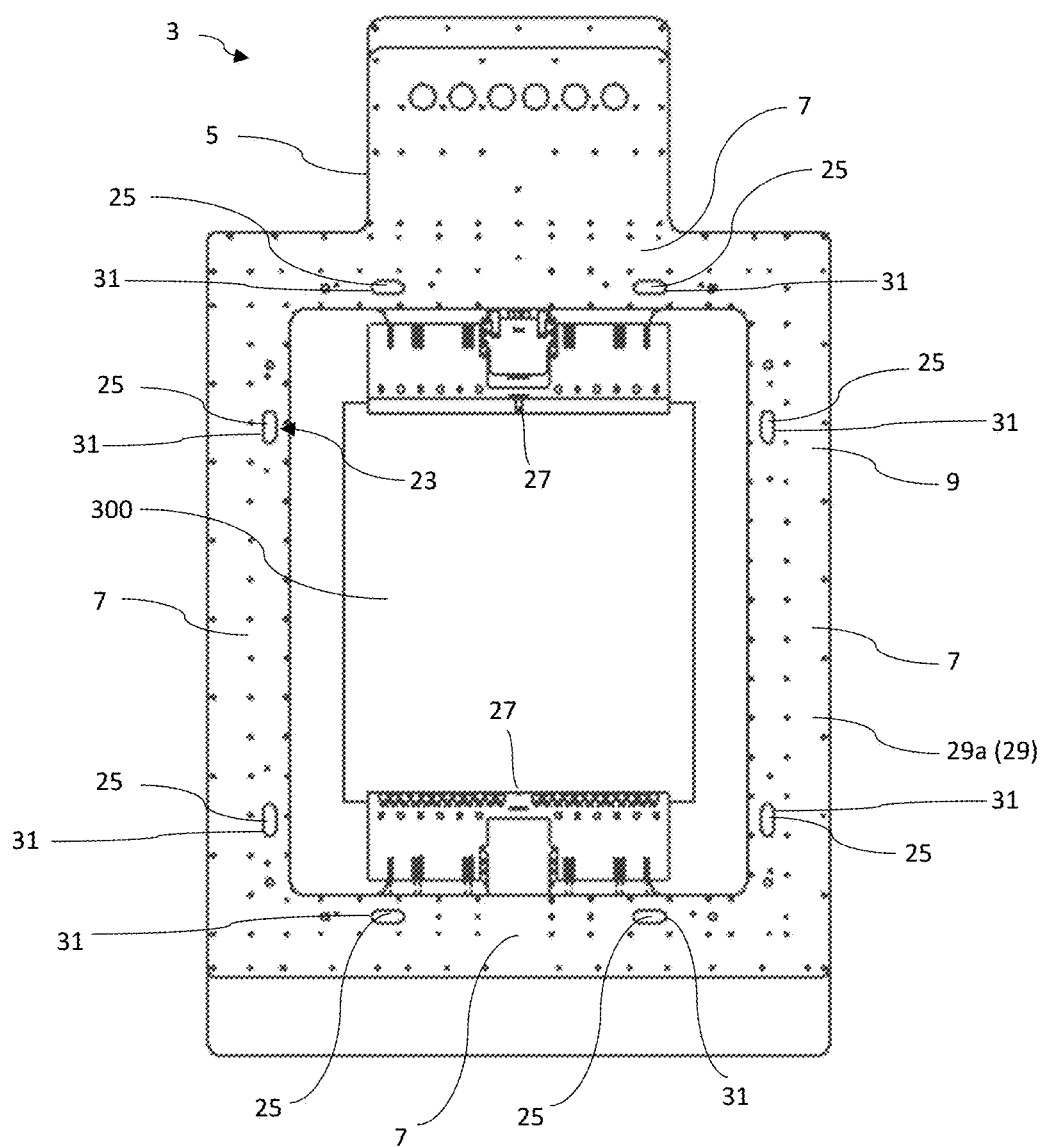

With reference to FIG. 2, the board holding device 3 includes two fitting pins 27 which are each introduced in a respective retaining opening, e.g., fitting bore, provided in the board 300 and corresponding to the respective fitting pin 27 (at upper and lower edges of the board 300) (not shown) and are attached to respective frame elements 7 (e.g., in FIG. 2, to an upper frame element and a lower frame element) so that the board 300 is held by the carrier frame 5 (at the upper and lower edges of the board 300). As can be seen in FIG. 2 in conjunction with FIG. 9B, the carrier frame 5 is formed by means of the frame elements 7 in a layered construction, wherein the carrier frame 5 is made of several carrier frame layers 29 which may be formed by one or more frame elements 7 respectively. For example, the carrier frame layer 29 of the carrier frame 5 visible in FIG. 2 is formed of four frame elements 7 including an upper, a lower, a left and a right frame element which are integrally (e.g., in one piece) connected. However, it is also conceivable that the frame elements 7 may also be connected to each other in a different way (e.g., by means of a detachable type of connection). As shown schematically in FIG. 9B, the present carrier frame 5 has the following three layers: two covering carrier frame layers 29a (one of which is shown in a frontal view in FIG. 2) and a middle carrier frame layer 29b located therebetween. The eight pneumatically operable expansion elements 25 of the embodiment shown in FIG. 2 are each arranged in the middle carrier frame layer 29b, wherein eight openings 31 corresponding to the respective expansion element 25 are formed in the covering carrier frame layer 29a, through which (in a respectively assigned way) the expansion elements 25 expand and can also shrink back again due to a pneumatic effect (cf. FIGS. 7 and 9B). The pneumatically operated expansion elements 25 are in this case bellows expansion elements, which are at least partially made of rubber. The respective expansion elements 25 and the respective corresponding openings 31 are arranged opposite each other on the frame elements 7 and, in this case, arranged in pairs opposite each other. The fixing device 23 also includes pneumatic lines (not shown in the figures) which are respectively connected to the expansion elements 25 and which are connected to a pneumatic source (not shown in the figures) installed in the filling assembly 1 for providing a pneumatic pressure. The pneumatic lines are in this context arranged in the middle carrier frame layer 29b.

Figure 3:
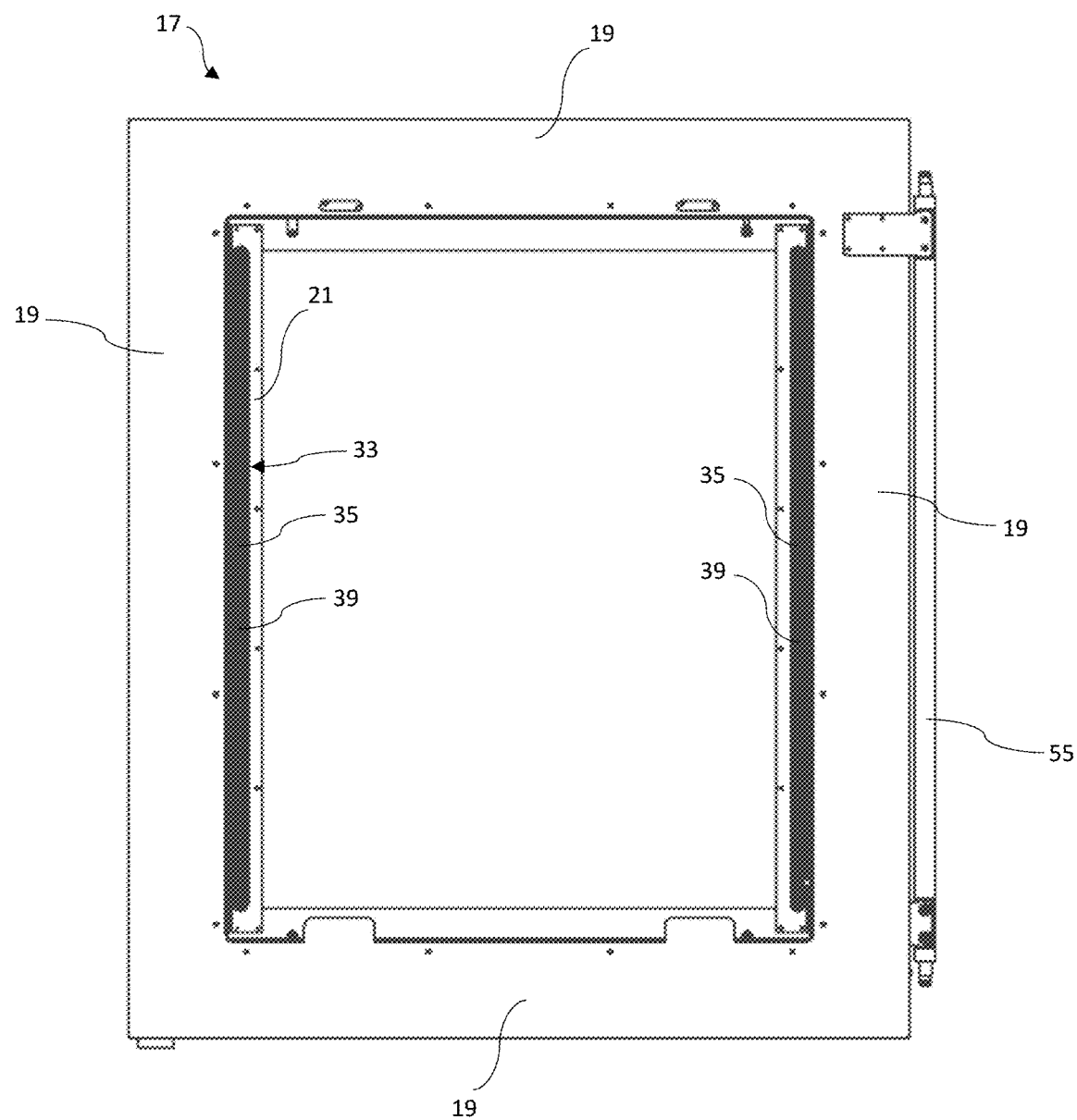
Figure 4:
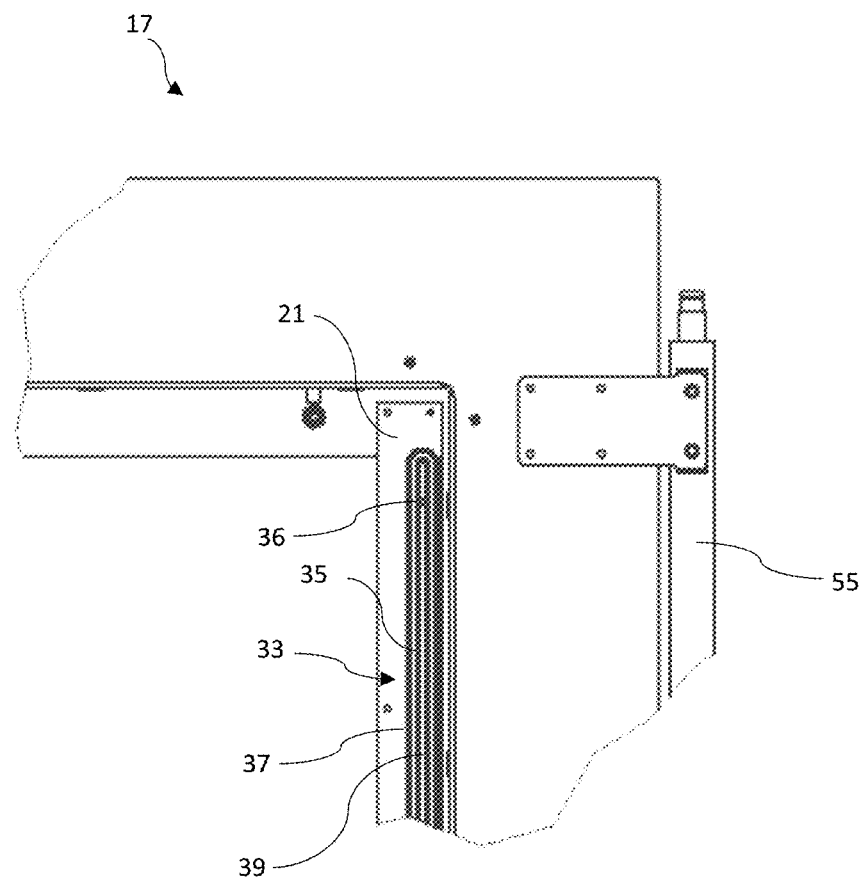

With reference to FIGS. 3 and 4, the filling assembly 1 is further provided with a negative pressure device 33, which is arranged on several of the screen holding frame elements 19 (e.g., in FIG. 3, on a left screen holding frame element and right screen holding frame element) and by means of which a negative pressure can be generated reversibly (i.e., a negative pressure can be generated and released again) on an abutment surface 35 formed by the screen holding frame elements 19, on which the screen frame 203 of the held screen abuts on the screen holding frame (cf. FIG. 5), by which a suction force is caused which acts at least substantially perpendicular to the carrier frame surface 9, to draw or suction the screen frame 203 to the screen holding frame 17 to fix the screen 200 to the screen holding frame 17. The negative pressure device 33 further includes (e.g., at least) two openings 36 which are respectively formed in the abutment surface 35 on the respective (in FIG. 3, left and right) screen holding frame elements 19 and through which air can be drawn or suctioned away by means of the negative pressure device 33 to generate the negative pressure for causing the suction force and through which air can be supplied again to release the negative pressure. The negative pressure device 33 includes two seals 37 (e.g., two O-ring seals) (cf. FIG. 4), each of which delimits a respective suction area 39 extending along the abutment surface 35 and against which the screen frame 203 of the held screen 200 can tightly abut, in order to enable the negative pressure to be generated between the screen frame 203 and the abutment surface 35 in the suction area 39. The respective suction area 39 is formed to be elongated and extends vertically in its longitudinal direction along the respective screen holding frame elements 19. The two suction areas 39 are located on opposite screen holding frame elements 19 (with respect to the screen 200 and in the direction parallel to the screen holding frame surface 21 and screen surface 205, respectively). Thus, starting from the view in FIG. 3, one (e.g., the first) suction area 39 is located on the left screen holding frame element 19 and the other (e.g., the second) suction area 39 is located on the opposite, right screen holding frame element 19.

With reference to FIGS. 1-3, the left suction area 39 shown in FIG. 3 is arranged opposite the two expansion elements 25 shown in FIG. 2 and arranged at the right frame element 7, and the right suction area 39 shown in FIG. 3 is arranged opposite the two expansion elements 25 shown in FIG. 2 and arranged at the left frame element 7.

Figure 5:
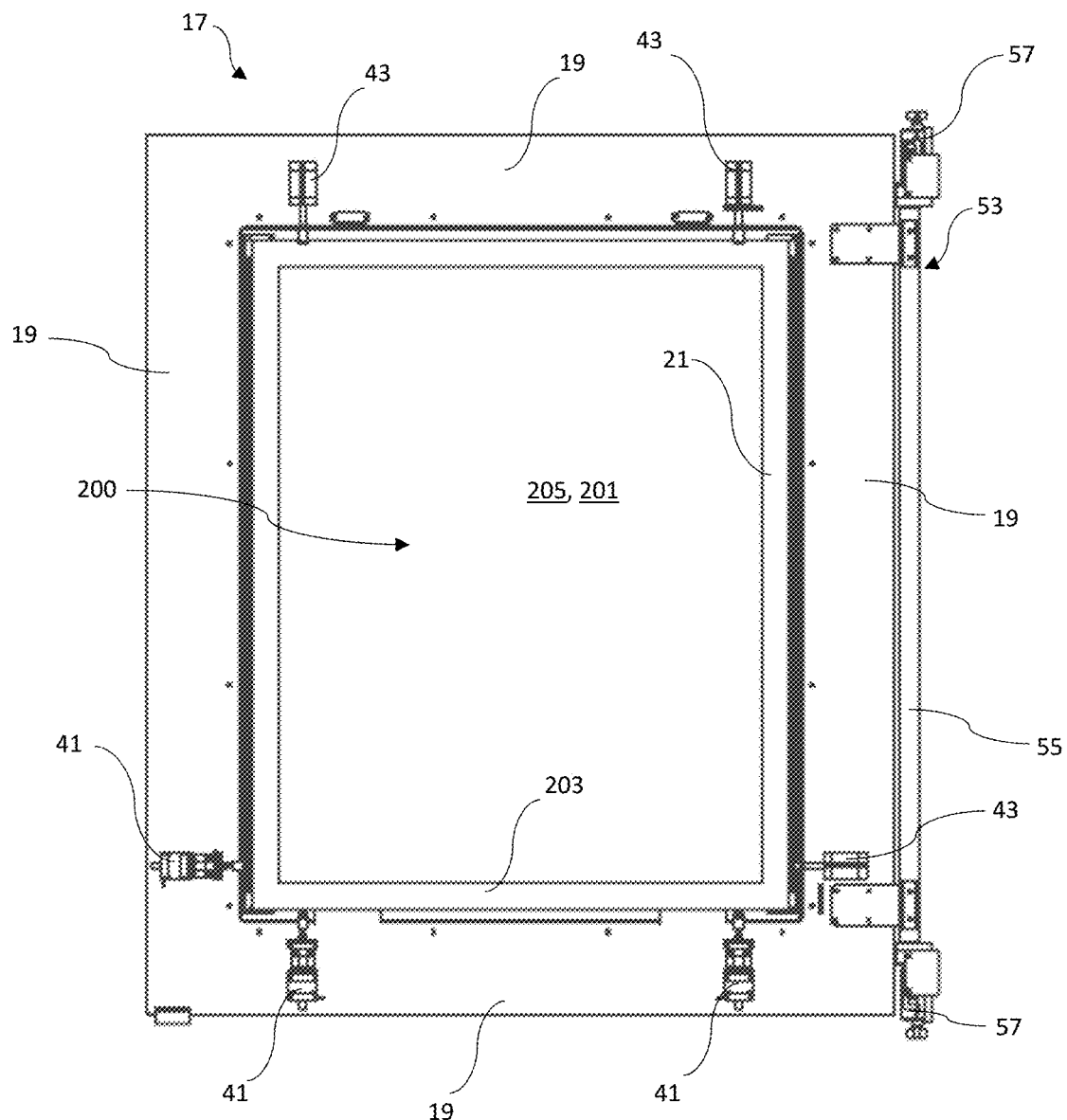

As shown in FIG. 5, two electric actuators 41 are arranged at a distance from one another in the lower screen holding frame element 19 and one electric actuator 41 is arranged in the left screen holding frame element 19 adjacent to the lower screen holding frame element 19, wherein those electric actuators 41 are engaged with the screen frame 203 of a screen 200 held in the screen holding frame 17 in order to be able to adjust the held screen 200 relative to the screen holding frame 17 at least substantially in a direction parallel to the screen holding frame surface 21. Opposite each electric actuator 41, an elastic element 43 in the form of a gas spring is arranged in the respective (opposite) screen holding frame element 19, which also is engaged with the screen frame 203 in order to support the latter in a spring-elastic way relative to the screen holding frame 17 at least substantially in the direction parallel to the screen holding frame surface 21. By means of this arrangement it is possible to adjust (e.g., move) the screen 200 both substantially parallel to the screen holding frame surface 21 substantially vertically and/or substantially horizontally, and to adjust (e.g., move) the screen rotationally substantially parallel to the screen holding frame surface 21 about an axis of rotation which is substantially perpendicular with respect to the screen holding frame surface 21. This allows the screen 200 to be aligned (locally) with respect to the holes formed in the board 300.

For this purpose, amongst others, of the previously described alignment (i.e., for example for this purpose), as shown in FIG. 1 (and FIG. 6), the filling assembly 1 also includes a control device 49 and a camera device 45 with a camera 47 connected to the control device 49 (cf. FIG. 10) and which is arranged and configured to obtain image information of the board 300 and the screen 200 by means of the camera 45 and then to provide this image information to the control device 49 connected to the camera device 45, so that a relative alignment of the board 300 and the screen 200 with respect to each other can be determined by the control device 49. A result of this determination allows the screen 200 to be locally aligned with respect to the holes formed in the board 300 by means of controlling the previously described actuators 41 by the control device 49. The camera 47 of the camera device 45 is mounted on the filling device 11 in this context and can therefore be moved together with it (substantially vertically) by means of the spindle drive 51. Furthermore, the camera 47 is mounted to the filling device 11 (e.g., to a spindle actuator arranged therebetween) in such a way that it can also be moved substantially horizontally relative to the filling device 11 at least substantially parallel to the carrier frame surface 9.

Again with reference to FIGS. 3-5, the screen holding frame 17 shown there is equipped with a pivoting device 53 by means of which the screen holding frame 17 is pivotable about an at least substantially vertical pivot axis 55 between a first position in which the screen holding frame 17 is arranged with its screen holding frame surface 21 at least substantially parallel to the carrier frame surface 9 and a second position in which an angle is formed between the screen holding frame surface 21 and the carrier frame surface 9. The pivoting device 53 further includes a pivot drive 57, by means of which an automatic pivoting mechanism is realized in order to be able to effect automatically a pivoting of the screen holding frame 17 between the first and second positions (and vice versa). Furthermore, an actuating unit (not shown in the figures) for adjusting a distance of the fixed screen 200 with respect to a held board 300 (e.g., directly) adjacent to the pivot drive 57 may be provided on the screen holding frame 17 to be able to variably adjust said distance depending on the thickness of the held board 300.

Figure 10:
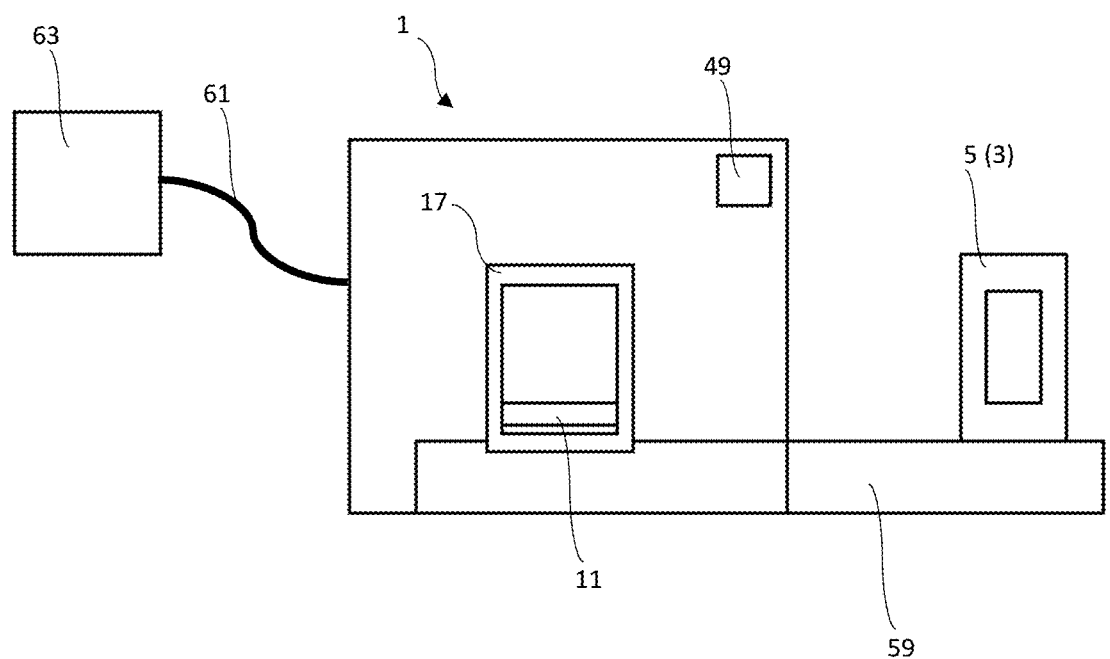

As shown schematically in FIG. 10, the filling assembly 1 is further provided with a movement device 59, by which the board holding device 3 is movably supported, so that the board holding device 3 can be moved in a direction at least substantially parallel to the carrier frame surface 9 and, for example at least substantially horizontal between a loading and unloading position, in which the board holding device 3 is positioned out of operative engagement with the filling device 11 to enable a filled board 300 to be removed from the carrier frame 5 and the carrier frame 5 to be loaded with a board 300 to be filled, and a hole filling position, in which the board holding device 3 is positioned in operative engagement with the filling device 11 to enable holes in a held board 300 to be filled with filling material. In FIG. 10, the board holding device 3 is shown by way of example at the loading and unloading position. The previously described pivot axis 55 of the screen holding frame 17 is arranged with regard to the board holding device 3 on a side of the board holding device 3 opposite to the loading and unloading position (i.e., according to FIG. 10, on the left side of the screen holding frame 17).

Figure 6:
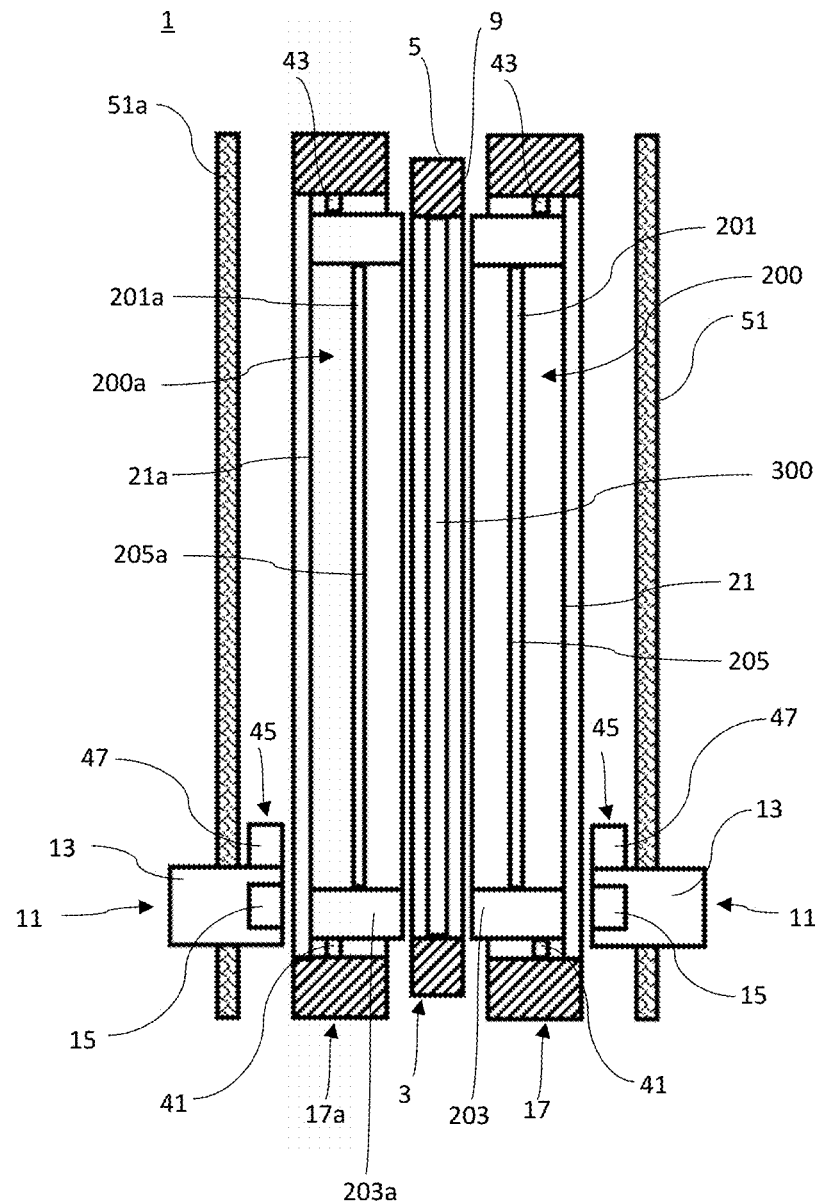

The embodiment shown in FIG. 6 is generally configured like the embodiment of FIG. 1, so only the differences are described in the following. Referring to FIGS. 6-10, the filling assembly 1 of the embodiment of FIG. 6 further includes: a further filling device 11a, which is arranged in the direction perpendicular to the carrier frame surface 9 on the opposite, other side of the carrier frame 5 and which is configured in a manner similar to the filling device 11 described above, and a further screen holding frame 17a for holding a further screen 200a, wherein the further screen holding frame 17a and the further screen 200a are respectively configured in a manner as the previously described screen holding frame 17 and the previously described screen 200, wherein the fixing device 23 is configured in a manner to also fix the further screen 200a to the further screen holding frame 17a in a manner as previously described with respect to the screen 200 and the screen holding frame 17, wherein the at least one pneumatically operable expansion element 25 (e.g., and/or the eight pneumatically operable expansion elements 25 of the previously described embodiment, cf. FIG. 2) of the fixing device 23 are configured in such a way that a (respective) compressive force, which acts at least substantially perpendicular to the carrier frame surface 9, can also be applied by it (them) to the further screen frame 203a of the further held screen 200a by pneumatically effected reversible expansion, in order to press the further screen frame 203a against the further screen holding frame 17a to fix the further screen 200a to the further screen holding frame 17a.

Figure 7:
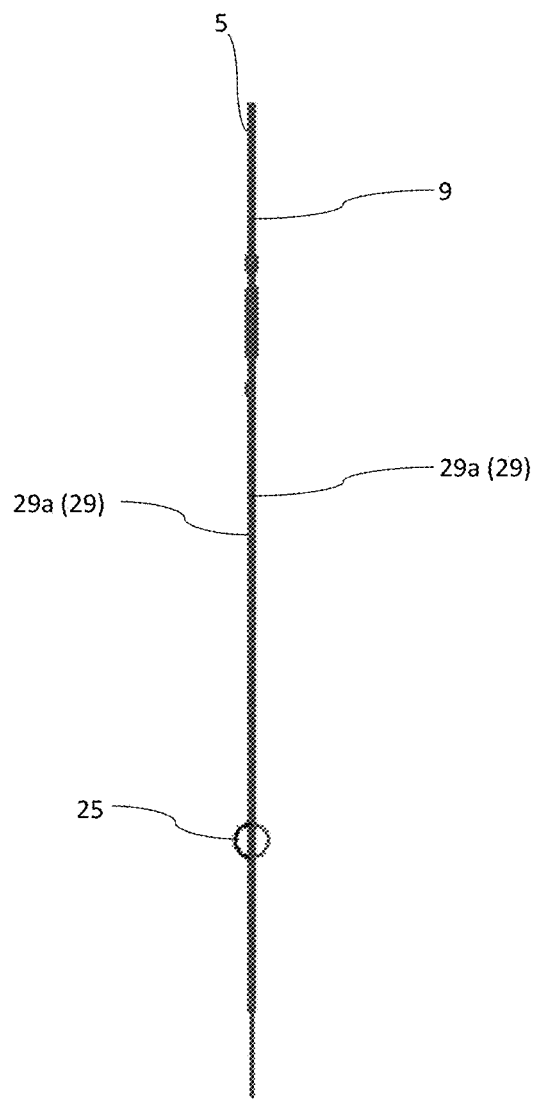
Figure 8:
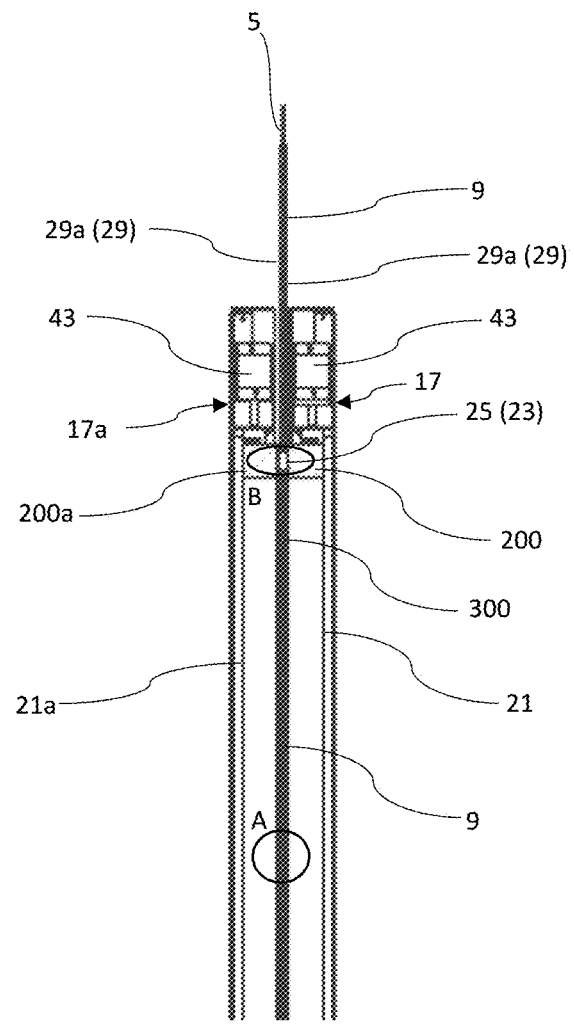
Figure 9A:
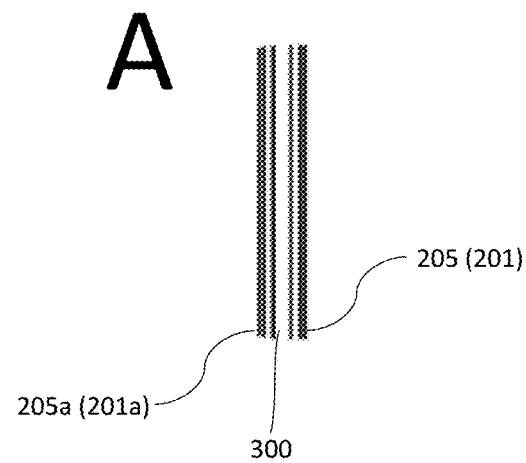
Figure 9B:
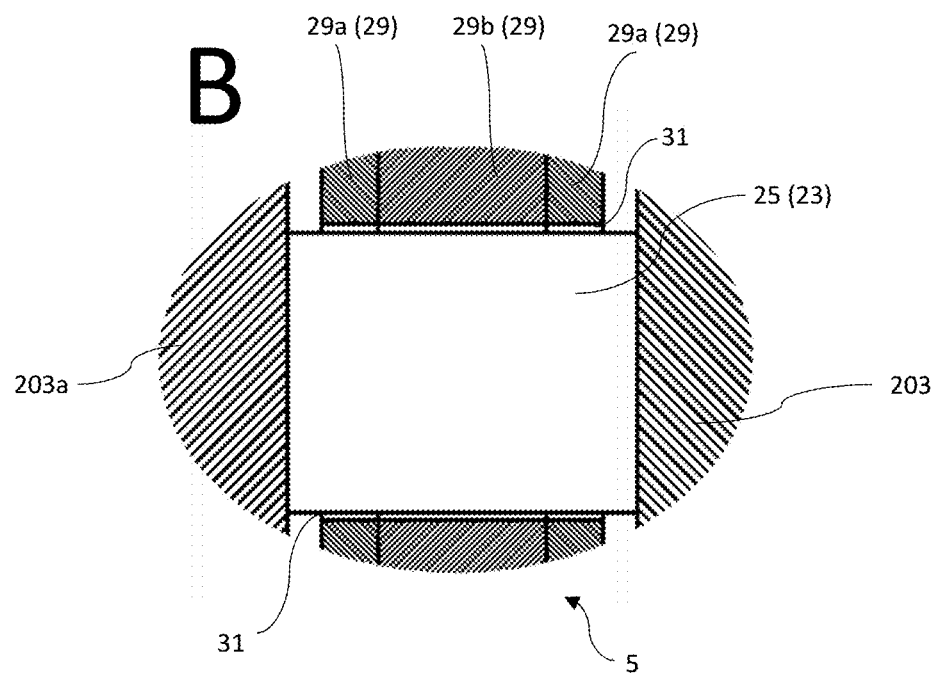

With reference to FIGS. 7, 8 and 9B, a respective opening 31 corresponding to the respective expansion element 25 and opposed with respect to the covering carrier frame layers 29a is formed in both covering carrier frame layers 29a of the carrier frame 5, through which the respective expansion element 25 can expand pneumatically (reversibly) (i.e., respectively in the direction of the respective covering carrier frame layer 29a), so that the respective expansion element 25 extends through the carrier frame 5 in the direction perpendicular to the carrier frame surface 9 and protrudes therefrom (in FIGS. 7 and 9B respectively shown by way of example for one expansion element 25) in order to be able to cause the respective compressive force. As shown in FIG. 8, each screen 200, 200a is in a state in which it is pressed with its respective screen frame 203, 203a for fixing against the respective screen holding frame 17, 17a by means of the expansion elements 25, wherein in the sectional view of FIG. 8, for simplification only one expansion element 25 arranged in the upper frame element 7 is shown schematically. In this context, FIG. 9A schematically illustrates the parallel alignment of the screen cloths 201, 201a of the respective screens 200, 200a with respect to the board 300 held substantially vertically by the carrier frame 5. Furthermore, FIG. 9B schematically illustrates in this context the expansion element 25 arranged in the upper frame element 7, which extends through the respective opposite openings 31 of the respective covering carrier frame layer 29a by pneumatically caused, reversible expansion (in the direction perpendicular to the carrier frame surface 9 of the carrier frame 5) and protrudes from the respective covering carrier frame layer 29a in order to exert the respective compressive force on the respective screen frame 203, 203a.

Referring again to FIG. 10, the filling assembly 1 described above is connectable (or connected) via a power line 61 to an (external) power source 63. Furthermore, the control device 49 included in the filling assembly 1 is configured to control at least the (e.g., respective) filling device 11, 11a and the fixing device 23. Furthermore, the control device 49 is configured to control the camera device 45, the movement device 59 of the board holding device 3, the pivoting device 53, the electric actuators 41 and the respective spindle drives 51, 51a.

Figure 11:
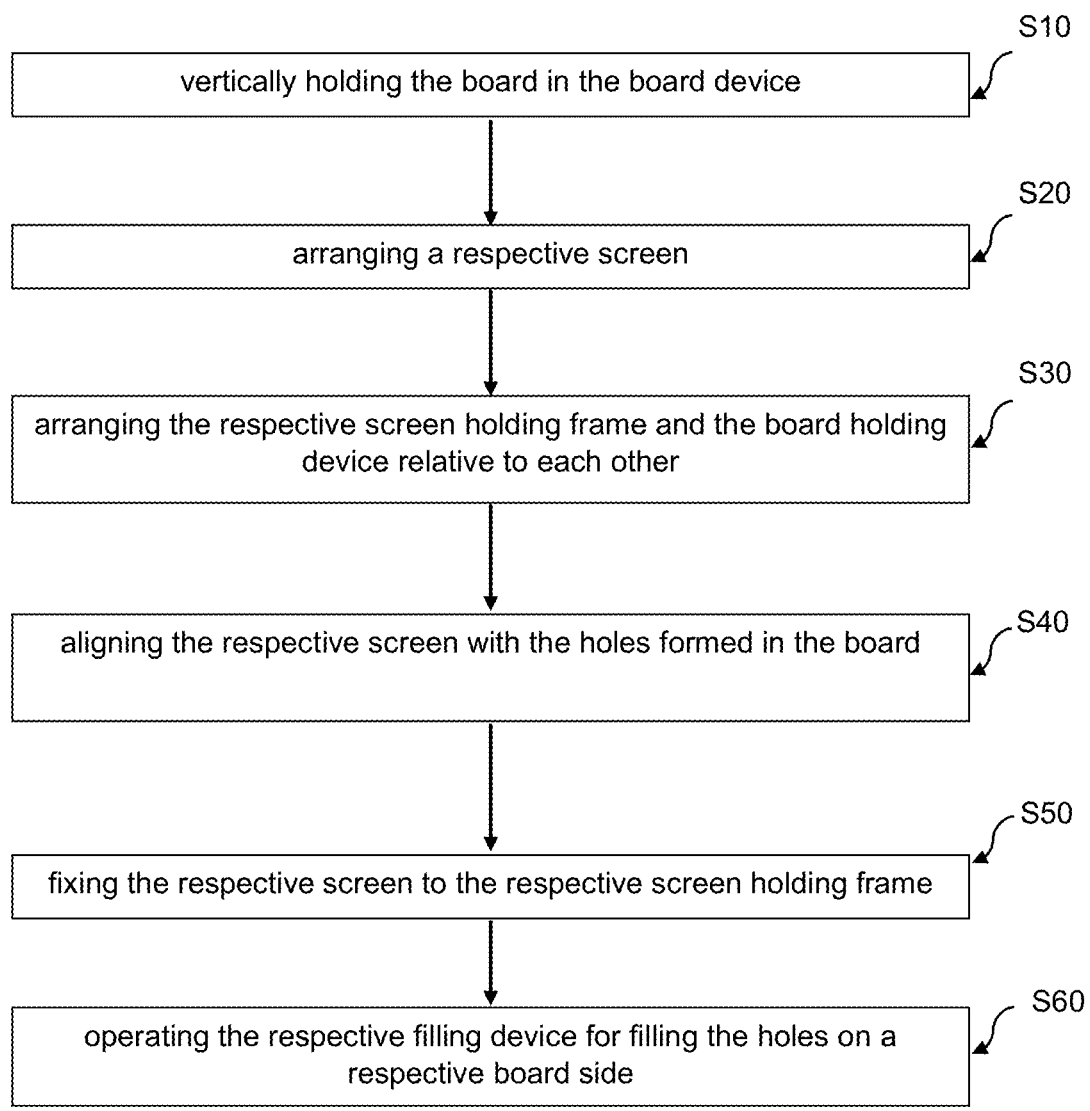
FIG. 11 shows a flowchart of a method for operating a filling assembly according to an embodiment of the present disclosure.

With reference to FIG. 11, a method for operating a filling assembly 1 for filling holes formed in a board 300, e.g., a printed circuit board, with a filling material (such as an epoxy resin) is further provided, wherein the filling assembly 1 is configured as described above. The method of FIG. 11 includes: vertically holding (S10) the board 300 in the board holding device 3 (by means of the carrier frame 5) (e.g., in the hole filling position) (cf. FIG. 2), arranging (S20) a respective screen 200, 200a, which includes a screen cloth 201, 201a and a screen frame 203, 203a surrounding the screen cloth 201, 201a, in the respective screen holding frame 17, 17a such that a screen surface 205, 205a defined by the respective screen 200, 200a is at least substantially parallel to the screen holding frame surface 21, 21a (cf. FIGS. 1, 6 and 8), arranging (S30) the respective screen holding frame 17, 17a and the board holding device 3 relative to each other in such a way that the respective screen 200, 200a is positioned on a respectively assigned board side in such a way that the respective screen surface 205, 205a is at least substantially parallel to the board 300 (cf. FIG. 9A), aligning (S40) the respective screen 200, 200a with the holes formed in the board 300 by moving the respective screen 200, 200a relative to the respective screen holding frame 17, 17a in a direction parallel to the screen holding frame surface 21, 21a (by means of the actuators 41, cf. FIG. 5), fixing (S50) the respective screen 200, 200a to the respective screen holding frame 17, 17a, and operating the respective filling device 11, 11a for filling the holes on a respective board side (S60), wherein the fixing (S50) of the respective screen 200, 200a to the respective screen holding frame 17, 17a includes: applying pneumatic pressure to the expansion elements 25 of the fixing device 23 for expanding the expansion elements 25, to thereby exert a respective compressive force, acting substantially perpendicular to the carrier frame surface 9, on the screen frame 203, 203a of the respective screen 200, 200a, so that the screen frame 203, 203a of the respective screen 200, 200a is pressed against the respectively assigned screen holding frame 17, 17a (cf. FIG. 8), to fix the screen 200, 200a to the respectively assigned screen holding frame 17, 17a. The fixing of the respective screen 200, 200a to the respective screen holding frame 17, 17a further includes: first applying pneumatic pressure to the expansion elements 25 of the fixing device 23, which is carried out until the screen frame 203, 203a of the respective screen 200, 200a is pressed into tight contact with the respective seals 37 of the negative pressure device 33 on the respective screen holding frame 17, 17a, and then operating the negative pressure device 33 on the respective screen holding frame 17, 17a for generating a negative pressure in the respective suction areas 39 delimited by the respective seals 37, thereby causing a suction force which acts substantially perpendicular to the carrier frame surface 9 and which is exerted on the screen frame 203, 203a of the respective screen 200, 200a, so that the screen frame 203, 203a of the respective screen 200, 200a is drawn or suctioned to the respectively assigned screen holding frame 17, 17a, to fix the respective screen 200, 200a to the respectively assigned screen holding frame 17, 17a.

Figure 12:
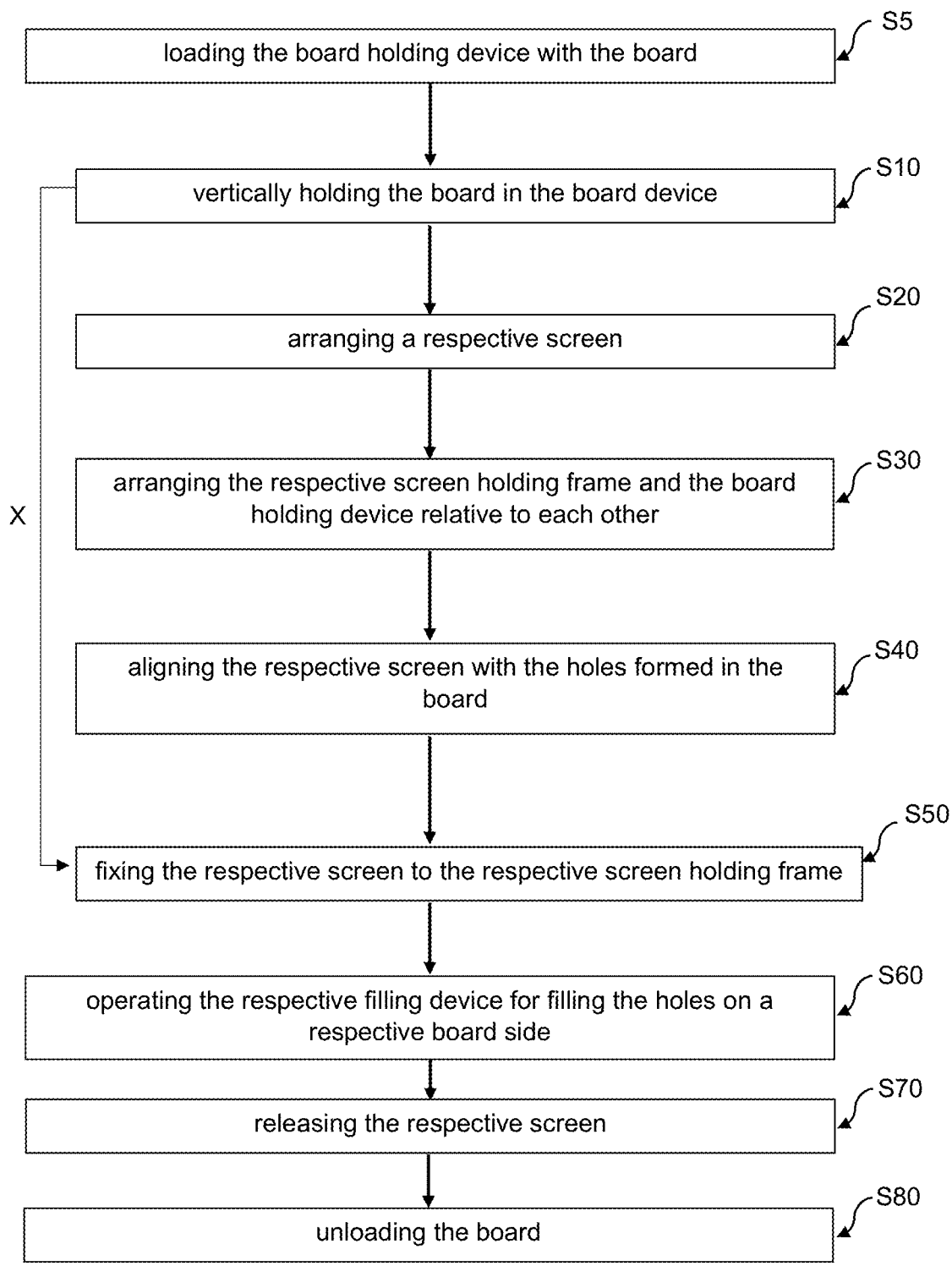
FIG. 12 shows a flowchart of a method for operating a filling assembly according to an embodiment of the present disclosure.

The embodiment shown in FIG. 12 is generally configured in the same way as the embodiment of FIG. 11, so only the differences are described below. The method of FIG. 12 further includes: before vertically holding (S10) the board 300 in the board holding device 3, loading (e.g., arranging) (S5) the board holding device 3 with the board 300 in the loading and unloading position, so that the board 300 is held vertically (e.g., substantially vertically) by the board holding device 3 (by means of the carrier frame 5).

The vertical holding (S10) of the board 300 in the board holding device 3 in FIG. 12 further includes: vertically holding the board 300 in the board holding device 3 (by means of the carrier frame 5) in the loading and unloading position, moving the board holding device 3 with the vertically held board 300 from the loading and unloading position to the hole filling position by means of the movement device 59, in order to be able to fill the holes in the held board 300 with filling material, pivoting the respective screen holding frame 17, 17a about its pivot axis 55 from its second position, in which an angle is formed between the respective screen holding frame 17, 17a with its screen holding frame surface 21 and the carrier frame surface 9, to its first position in which the respective screen holding frame 17, 17a with its screen holding frame surface 21 is arranged at least substantially parallel to the carrier frame surface 9, and maintaining the vertical holding of the board 300 in the board holding device 3 in the hole filling position.

The method of FIG. 12 further includes: after operating (S60) the respective filling device 11, 11a for filling the holes, releasing (S70) the respective screen 200, 200a by reducing the applied pneumatic pressure of the expansion elements 25 for shrinking the expansion elements 25, to thereby reduce the compressive force applied to the screen frame 203, 203a of the respective screen 200, 200a in such a way that the screen frame 203, 203a of the respective screen 200, 200a is no longer pressed against the respective screen holding frame 17, 17a (wherein, however, the respective screen frame 203, 203a is still drawn or suctioned to the respective screen holding frame 17, 17a). Following this, the method further includes: unloading (S80) the board, including: pivoting the respective screen holding frame 17, 17a about its pivot axis 55 from its first position to its second position, moving the board holding device 3 with the vertically held board 300 (with the filled holes) from the hole filling position to the loading and unloading position by means of the movement device 59 to be able to remove the held board 300 from the board holding device 3, and removing (e.g., unloading) the board 300 from the board holding device 3.

If the board holding device is now loaded with a subsequent board (e.g., another board following the board, e.g., a second board) as described above, in order to fill its holes, the method described with respect to FIG. 12 can be repeated, wherein a new arranging of a respective screen 200, 200a (S20), a new arranging of the respective screen holding frame 17, 17a and the board holding device 3 relative to each other (S30) and a new aligning of the respective screen 200, 200a with the holes formed in the board 300 (S40) is not necessary, since the respective screen 200, 200a is still fixed by suction by means of the negative pressure device 33. In FIG. 12, this is shown by the arrow marked with "X". However, it is also conceivable to carry out the previously mentioned process steps again, wherein here the releasing (S70) of the respective screen 200, 200a further includes: releasing the respective screen 200, 200a by reducing the negative pressure, in order to thereby reduce the suction force exerted on the screen frame 203, 203a of the respective screen 200, 200a in such a way that the screen frame 203, 203a of the respective screen 200, 200a is no longer drawn or suctioned to the respective screen holding frame 17, 17a.

Example 1 is a filling assembly (1) for filling holes formed in a board (300) (e.g., a printed circuit board) with a filling material, comprising: a board holding device (3) which includes a carrier frame (5) which is formed by frame elements (7) and which defines an at least substantially vertical carrier frame surface (9) and by which the board (300) can be held at least substantially parallel to the carrier frame surface (9); at least one filling device (11) which is arranged on a side of the carrier frame (5) and which includes a filling material feeding device (13) with a filling head (15), by means of which a filling material can be fed to the board (300), held by the carrier frame (5), from a board side, wherein the filling head (15) is movable relative to the carrier frame (5) at least substantially parallel to the carrier frame surface (9) along at least one dimension; at least one screen holding frame (17) which is formed by screen holding frame elements (19) and defines a screen holding frame surface (21) and by which a screen (200) can be held between the carrier frame (5) and the filling device (11), so that the filling material can be fed by means of the filling head (15) passing through the held screen (200), to the board (300) held by the carrier frame (5), wherein the screen (200) includes a screen cloth (201) and a screen frame (203) surrounding the screen cloth (201); and a fixing device (23) with at least one pneumatically or hydraulically operable expansion element (25) which is arranged in one or more of the frame elements (7) and by means of which a compressive force which acts at least substantially perpendicular to the carrier frame surface (9) is applicable to the screen frame (203) of the held screen (200) by pneumatically or hydraulically caused reversible expansion, in order to press the screen frame (203) against the screen holding frame (17) to fix the screen (200) to the screen holding frame (17).

Example 2 is a filling assembly (1) according to Example 1, further having a negative pressure device (33) which is arranged on one or more of the screen holding frame elements (19) and by means of which a negative pressure can be generated on an abutment surface (35) formed by the screen holding frame elements (19), on which the screen frame (203) of the held screen (3) abuts on the screen holding frame (17), by which a suction force acting at least substantially perpendicular to the carrier frame surface (9) is caused, in order to draw or suction the screen frame (203) to the screen holding frame (17) to fix the screen (200) to the screen holding frame (17).

Example 3 is a filling assembly (1) according to Example 2, wherein the negative pressure device (33) includes at least a seal (37), optionally an O-ring seal, which delimits a suction area (39) extending along the abutment surface (35) and against which the screen frame (203) of the held screen (200) can tightly abut in order to allow the generation of the negative pressure between the screen frame (203) and the abutment surface (35) in the suction area (39).

Example 4 is a filling assembly (1) according to Example 3, wherein the negative pressure device (33) includes at least one further seal (37), optionally a further O-ring seal, which delimits a further suction area (39) configured in a manner similar to the suction area (39) described in Example 3, wherein the suction area (39) and the further suction area (39) are located on opposing screen holding frame elements (19).

Example 5 is a filling assembly (1) according to any one of Examples 1-4, wherein the pneumatically or hydraulically operable expansion element (25) of the fixing device (23) is a bellows expansion element, e.g., an operable bellows cylinder, and/or wherein the pneumatically or hydraulically operable expansion element (25) of the fixing device (23) is made of an elastic material, e.g., rubber.

Example 6 is a filling assembly (1) according to any of Examples 1-5, wherein the fixing device (23) has at least one further pneumatically or hydraulically operable expansion element (25) configured in a manner similar to the expansion element (25) described in the preceding Examples, wherein the expansion element (25) and the further expansion element (25) are located on opposing frame elements (7).

Example 7 is a filling assembly (1) according to Examples 4 and 6, wherein a respective suction area (39) is arranged opposite a respective expansion element (25).

Example 8 is a filling assembly (1) according to any one of Examples 1-7, wherein at least one actuating element (41), e.g., an electric actuator, which can be engaged with the screen frame (203) of the held screen (200), is arranged on and/or in one or more of the screen holding frame elements (19), in order to be able to adjust the held screen (200) relative to the screen holding frame (17) at least substantially in a direction parallel to the screen holding frame surface (21).

Example 9 is a filling assembly (1) according to any one of Examples 1-8, wherein an elastic element (43) is arranged on and/or in one or more of the screen holding frame elements (19), which can be engaged with the screen frame (203) of the held screen (200), in order to support the held screen (200) relative to the screen holding frame (17) in a spring-elastic manner at least substantially in the direction parallel to the screen holding frame surface (21).

Example 10 is a filling assembly (1) according to any one of Examples 1-9, further having a movement device (59) by which the board holding device (3) is movably supported, so that the board holding device (3) is movable in a direction at least substantially parallel to the carrier frame surface (9) and e.g., at least substantially horizontal, between a loading and unloading position in which the board holding device (3) is positioned out of operative engagement with the filling device (11) in order to be able to remove a filled board (300) from the carrier frame (5) and load the carrier frame (5) with a board (300) to be filled, and a hole filling position in which the board holding device (3) is positioned in operative engagement with the filling device (11), in order to be able to fill holes in a held board (300) with filling material.

Example 11 is a filling assembly (1) according to any one of Examples 1-10, wherein the screen holding frame (17) is pivotable about an at least substantially vertical pivot axis (55) between a first position in which the screen holding frame (17) is arranged with its screen holding frame surface (21) at least substantially parallel to the carrier frame surface (9), and a second position in which an angle is formed between the screen holding frame surface (21) and the carrier frame surface (9).

Example 12 is a filling assembly (1) according to Examples 10 and 11, wherein the pivot axis (55) is arranged on a side of the board holding device (3) opposite to the loading and unloading position with respect to the board holding device (3).

Example 13 is a filling assembly (1) according to any one of Examples 1-12, further comprising the screen (200).

Example 14 is a filling assembly (1) according to any one of Examples 1-13, further including: a further filling device (11a) which is arranged in the direction perpendicular to the carrier frame surface (9) on the opposite, other side of the carrier frame (5) and which is configured in a manner as the filling device (11) described in the preceding Examples, and a further screen holding frame (17a) for holding a further screen (200a), wherein the further screen holding frame (17a) and the further screen (200a) are respectively configured in a manner as the screen holding frame (17) described in the preceding Examples and the screen (200) described in the preceding Examples, wherein the fixing device (23) is configured in a manner to fix also the further screen (200a) to the further screen holding frame (17a) in a manner described in the preceding Examples with respect to the screen (200) and the screen holding frame (17), wherein the at least one pneumatically or hydraulically operable expansion element (25) of the fixing device (23) is configured in such a way that also a compressive force acting at least substantially perpendicular to the carrier frame surface (9) is applicable by means of it to the further screen frame (203a) of the further held screen (200a) by pneumatically or hydraulically caused reversible expansion, in order to press the further screen frame (203a) against the further screen holding frame (17a) to fix the further screen (200a) to the further screen holding frame (17a).

Example 15 is a filling assembly (1) according to Example 14, further including the further screen (200a).

Example 16 is a filling assembly (1) according to any one of Examples 1-15, in combination with at least one board (300), e.g., at least one printed circuit board, in which holes are formed.

Example 17 is a method for operating a filling assembly (1) for filling holes formed in a board (300), e.g, a printed circuit board, with a filling material according to any one of Examples 1-16, including: vertically holding (S10) the board (300) in the board holding device (3); arranging (S20) a respective screen (200, 200a), which includes a screen cloth (201, 201a) and a screen frame (203, 203a) surrounding the screen cloth (201, 201a), in the respective screen holding frame (17, 17a) in such a way that a screen surface (205, 205a) defined by the respective screen (200, 200a) is at least substantially parallel to the screen holding frame surface (21); arranging (S30) the respective screen holding frame (17, 17a) and the board holding device (3) relative to each other such that the respective screen (200, 200a) is positioned on a respectively assigned board side in such a way that the respective screen surface (205, 205a) is substantially parallel to the board (300); aligning (S40) the respective screen (200, 200a) with the holes formed in the board (300) by moving the respective screen (200, 200a) relative to the respective screen holding frame (17, 17a) in a direction parallel to the screen holding frame surface (21); fixing (S50) the respective screen (200, 200a) to the respective screen holding frame (17, 17a); and operating (S60) the respective filling device (11, 11a) for filling the holes on a respective board side, wherein fixing (S50) the respective screen (200, 200a) to the respective screen holding frame (17, 17a) includes: applying pneumatic or hydraulic pressure to the expansion element (25) of the fixing device (23) to expand the expansion element (25), to thereby exert a compressive force acting substantially perpendicular to the carrier frame surface (9) on the screen frame (203, 203a) of the respective screen (200, 200a), so that the screen frame (203, 203a) of the respective screen (200, 200a), to fix the same to the respectively assigned screen holding frame (17, 17a), is pressed against the same.

Example 18 is a method according to Example 17, wherein the filling assembly (1) is configured according to any one of Examples 1, 5, 6, 8-16 in combination with Example 2 and any one of Examples 3, 4 or 7, wherein the fixing (S50) the respective screen (200, 200a) to the respective screen holding frame (17, 17a) includes: first applying pneumatic or hydraulic pressure to the expansion element (25) of the fixing device (23), which is carried out until the screen frame (203, 203a) of the respective screen (200, 200a) is pressed into tight contact with the respective seal (37) of the negative pressure device (33) on the respective screen holding frame (17, 17a), and then operating the negative pressure device (33) on the respective screen holding frame (17, 17a) to generate a negative pressure in the suction area (39) delimited by the respective seal (37), thereby causing a suction force which acts substantially perpendicular to the carrier frame surface (9) and which is applied to the screen frame (203, 203a) of the respective screen (200, 200a), so that the screen frame (203, 203a) of the respective screen (200, 200a), to fix the same to the respectively assigned screen holding frame (17, 17a), is drawn or suctioned to the same.

Although the invention has been described by means of embodiments and examples, the invention is not limited to these embodiments and examples. Instead, the skilled person will also regard alternatives and modifications as covered by the invention, provided that they are within the scope of protection defined by the claims.

LIST OF REFERENCE SIGNS

1: filling assembly
3: board holding device
5: carrier frame
7: frame element
9: carrier frame surface
11, 11a: filling device
13: filling material feeding device
15: filling head
17, 17a: screen holding frame
19: screen holding frame element
21, 21a: screen holding frame surface
23: fixing device
25: expansion element
27: fitting pin
29: carrier frame layer
29a: covering carrier frame layer
29b: middle carrier frame layer
31: opening in covering carrier frame layer
33: negative pressure device
35: abutment surface
36: opening of the negative pressure device
37: seal
39: suction area
41: actuator
43: elastic element
45: camera device
47: camera
49: control device
51, 51a: spindle drive
53: pivoting device
55: pivot axis
57: pivot drive
59: movement device
61: power line
63: power source
200, 200a: screen 201, 201a: screen cloth
203, 203a: screen frame
205, 205a: screen surface
300: board

The invention claimed is:

1. A filling assembly for filling holes formed in a board with a filling material, comprising:
a board holding device which includes a carrier frame which is formed by frame elements and which defines an at least substantially vertical carrier frame surface, wherein the carrier frame is configured to hold the board at least substantially parallel to the carrier frame surface;
at least one filling device which is arranged on a side of the carrier frame and which includes a filling material feeding device with a filling head, wherein the filling material feeding device is configured to provide a filling material, via the filling head, to the board held by the carrier frame from a board side, wherein the filling head is movable relative to the carrier frame at least substantially parallel to the carrier frame surface along at least one dimension;
at least one screen holding frame which is formed by screen holding frame elements and defines a screen holding frame surface and is configured to hold a screen between the carrier frame and the filling device, wherein the filling head is configured to provide the filling material to pass through the held screen to the board held by the carrier frame, wherein the screen includes a screen cloth and a screen frame surrounding the screen cloth; and
a fixing device with at least one pneumatically or hydraulically operable expansion element which is arranged in one or more of the frame elements, wherein the at least one expansion element is configured to provide a compressive force, which acts at least substantially perpendicular to the carrier frame surface, to the screen frame of the held screen by pneumatically or hydraulically caused reversible expansion, in order to press the screen frame against a screen holding frame to fix the screen to the screen holding frame, wherein the screen holding frame is a respective one of the at least one screen holding frame.

2. The filling assembly according to claim 1, further comprising a negative pressure device which is arranged on one or more of the screen holding frame elements, wherein the negative pressure device is configured to generate a negative pressure on an abutment surface formed by the screen holding frame elements, on which the screen frame of the held screen abuts on the screen holding frame, to thereby generate a suction force acting at least substantially perpendicular to the carrier frame surface, in order to suction the screen frame to the screen holding frame to fix the screen to the screen holding frame.

3. The filling assembly according to claim 2, wherein the negative pressure device includes at least a seal which delimits a suction area extending along the abutment surface and against which the screen frame of the held screen can tightly abut in order to allow the generation of the negative pressure between the screen frame and the abutment surface in the suction area.

4. The filling assembly according to claim 3, wherein the negative pressure device includes at least one other seal which delimits another suction area, and the suction area and the another suction area are located on opposing screen holding frame elements.

5. The filling assembly according to claim 4, wherein the fixing device has at least one other pneumatically or hydraulically operable expansion element, wherein the at least one expansion element expansion element and the at least one other expansion element are located on opposing frame elements, and
the suction area and the another suction area is arranged opposite the at least one expansion element and the at least one other expansion element respectively.

6. The filling assembly according to claim 1, wherein the pneumatically or hydraulically operable expansion element of the fixing device is a bellows expansion element and/or wherein the pneumatically or hydraulically operable expansion element of the fixing device is made of an elastic material.

7. The filling assembly according to claim 1, wherein the fixing device has at least one other pneumatically or hydraulically operable expansion element, and the at least one expansion element expansion element and the at least one other expansion element are located on opposing frame elements.

8. The filling assembly according to claim 1, wherein at least one actuating element, which can be engaged with the screen frame of the held screen, is arranged on and/or in one or more of the screen holding frame elements, and the at least one actuating element is configured to adjust the held screen relative to the screen holding frame at least substantially in a direction parallel to the screen holding frame surface.

9. The filling assembly according to claim 1, wherein an elastic element is arranged on and/or in one or more of the screen holding frame elements, and the elastic element is configured to engage with the screen frame of the held screen in order to support the held screen relative to the screen holding frame in a spring-elastic manner at least substantially in the direction parallel to the screen holding frame surface.

10. The filling assembly according to claim 1, further comprising a movement device by which the board holding device is movably supported, so that the board holding device is movable in a direction at least substantially parallel to the carrier frame surface and at least substantially horizontally between a loading/unloading position and a hole filling position, wherein in the loading/unloading position the board holding device is positioned out of operative engagement with the filling device in order to be able to remove a filled board from the carrier frame and/or load a board to be filled on to the carrier frame, and in the hole filling position the board holding device is positioned in operative engagement with the filling device, in order to be able to fill holes in a held board with filling material.

11. The filling assembly according to claim 1, wherein the screen holding frame is pivotable about an at least substantially vertical pivot axis between a first position in which the screen holding frame is arranged with its screen holding frame surface at least substantially parallel to the carrier frame surface, and a second position in which an angle is formed between the screen holding frame surface and the carrier frame surface.

12. The filling assembly according to claim 10, wherein the screen holding frame is pivotable about an at least substantially vertical pivot axis between a first position and a second position, in the first position the screen holding frame is arranged with its screen holding frame surface at least substantially parallel to the carrier frame surface and in the second position the screen holding frame is arranged with its screen holding frame surface angled relative to the carrier frame surface, and the pivot axis is arranged on a side of the board holding device opposite to the loading and unloading position with respect to the board holding device.

13. The filling assembly according to claim 1, further comprising:
   another filling device which is arranged in the direction perpendicular to the carrier frame surface on another side of the carrier frame opposite said side of the carrier frame, and
   another screen holding frame for holding another screen; and
   wherein the fixing device is configured to fix the another screen to the another screen holding frame, and
   the at least one pneumatically or hydraulically operable expansion element of the fixing device is configured to generate a compressive force acting at least substantially perpendicular to the carrier frame surface on the another screen frame of the another held screen, in order to press the another screen frame against the another screen holding frame to fix the another screen to the another screen holding frame.

14. The filling assembly according to claim 1, wherein the board in which holes are formed is a printed circuit board.

15. A method for operating a filling assembly for filling holes formed in a board with a filling material, wherein the filling assembly includes:
   a board holding device having a carrier frame which is formed by frame elements and which defines an at least substantially vertical carrier frame surface, wherein the carrier frame is configured to hold the board at least substantially parallel to the carrier frame surface;
   at least one filling device which is arranged on a side of the carrier frame and which includes a filling material feeding device with a filling head, wherein the filling material feeding device is configured to provide a filling material to the board held by the carrier frame from at least one side of the board, and the filling head is movable relative to the carrier frame at least substantially parallel to the carrier frame surface along at least one dimension;
   at least one screen including a screen cloth and a screen frame surrounding the screen cloth;
   at least one screen holding frame which is formed by screen holding frame elements and defines a respective screen holding frame surface, wherein a respective screen holding frame is configured to hold a respective screen between the carrier frame and a respective filling device, wherein the filling head is configured to provide the filling material to pass through the respective screen to a respective side of the board; and
   a fixing device with at least one pneumatically or hydraulically operable expansion element which is arranged in one or more of the frame elements, wherein the at least one expansion element is configured to provide a compressive force which acts at least substantially perpendicular to the carrier frame surface to the screen frame of the respective held screen by pneumatically or hydraulically caused reversible expansion, in order to press the screen frame against the respective screen holding frame to fix the respective screen to the respective screen holding frame,
   the method comprising:
      vertically holding the board in the board holding device;
      arranging the respective screen in the respective screen holding frame in such a way that a screen surface defined by the respective screen is at least substantially parallel to the respective screen holding frame surface;
      arranging the respective screen holding frame and the board holding device relative to each other such that the respective screen is positioned on a respectively assigned board side in such a way that the respective screen surface is substantially parallel to the board;
      aligning the respective screen with the holes formed in the board by moving the respective screen relative to the respective screen holding frame in a direction parallel to the respective screen holding frame surface;
      fixing the respective screen to the respective screen holding frame; and
      operating a respective filling device for filling the holes on a respective board side,
      wherein fixing the respective screen to the respective screen holding frame includes applying pneumatic or hydraulic pressure to the at least one expansion element of the fixing device to expand the at least one expansion element, to thereby exert a compressive force acting substantially perpendicular to the carrier frame surface on the screen frame of the respective screen, so that the screen frame of the respective screen is pressed against the respective screen holding frame.

16. The method according to claim 15, wherein the filling assembly further includes:
   a negative pressure device which is arranged on one or more of the screen holding frame elements, wherein the negative pressure device is configured to generate a negative pressure on an abutment surface formed by the screen holding frame elements, on which the screen frame of the respective held screen abuts on the respective screen holding frame, wherein the negative pressure device includes at least one seal which delimits a suction area extending along the abutment surface and against which the screen frame of the respective held screen can tightly abut in order to allow the generation of the negative pressure between the screen frame and the abutment surface in the suction area, and
   wherein fixing the respective screen to the respective screen holding frame includes:
      first applying pneumatic or hydraulic pressure to the at least one expansion element of the fixing device, which is applied until the screen frame of the respective screen is pressed into tight contact with a respective seal of the negative pressure device on the respective screen holding frame, and then
      operating the negative pressure device on the respective screen holding frame to generate a negative pressure in the suction area delimited by the respective seal, thereby causing a suction force which acts substantially perpendicular to the carrier frame surface and which is applied to the screen frame of the respective screen, so that the screen frame of the respective screen is drawn or suctioned to the respective screen holding frame.

17. A filling assembly for filling holes formed in a board with a filling material, the filling assembly comprising:
   a board holding device including a carrier frame which is formed by frame elements and which defines an at least substantially vertical carrier frame surface, wherein the carrier frame is configured to hold the board at least substantially parallel to the carrier frame surface;

at least one filling device which is arranged on a side of the carrier frame and which includes a filling material feeding device with a filling head, wherein the filling material feeding device is configured to provide a filling material to the board held by the carrier frame from at least one side of the board, and the filling head is movable relative to the carrier frame at least substantially parallel to the carrier frame surface along at least one dimension;

at least one screen including a screen cloth and a screen frame surrounding the screen cloth;

at least one screen holding frame which is formed by screen holding frame elements and defines a screen holding frame surface, wherein a respective screen holding frame of the at least one screen holding frame is configured to hold a respective screen of the at least one screen between the side of the carrier frame and a respective filling device of the at least one filling device, wherein the filling head is configured to provide the filling material to pass through the respective screen to a respective side of the at least one side of the board; and a fixing device with at least one pneumatically or hydraulically operable expansion element which is arranged in one or more of the frame elements, wherein the at least one expansion element is configured to provide a compressive force which acts at least substantially perpendicular to the carrier frame surface to the screen frame of the respective held screen by pneumatically or hydraulically caused reversible expansion, in order to press the screen frame against the respective screen holding frame to fix the respective screen to the respective screen holding frame.

* * * * *